United States Patent
Wang et al.

(10) Patent No.: US 10,211,099 B2
(45) Date of Patent: Feb. 19, 2019

(54) CHAMBER CONDITIONING FOR REMOTE PLASMA PROCESS

(71) Applicant: Lam Research Corporation, Fremont, CA (US)

(72) Inventors: Deqi Wang, San Jose, CA (US); Gang Liu, Fremont, CA (US); Anand Chandrashekar, Fremont, CA (US); Tsung-Han Yang, San Jose, CA (US); John W. Griswold, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/384,175

(22) Filed: Dec. 19, 2016

(65) Prior Publication Data

US 2018/0174901 A1 Jun. 21, 2018

(51) Int. Cl.
   *H01L 21/31* (2006.01)
   *H01L 21/768* (2006.01)
   (Continued)

(52) U.S. Cl.
   CPC ........ *H01L 21/76879* (2013.01); *C23C 16/08* (2013.01); *C23C 16/4554* (2013.01);
   (Continued)

(58) Field of Classification Search
   CPC ........ H01L 21/28556; H01L 21/32133; H01L 21/7685; H01L 21/76876; H01L 21/76877; H01L 21/76879; H01L 21/76883; H01L 21/76898; H01L 27/1052; H01L 21/28562; H01L 21/76874; H01L 27/10891; H01J 37/3211
   (Continued)

(56) References Cited

U.S. PATENT DOCUMENTS

| 4,714,520 A | 12/1987 | Gwozdz |
| 4,746,375 A | 5/1988 | Iacovangelo |

(Continued)

FOREIGN PATENT DOCUMENTS

| CN | 101899649 A | 12/2010 |
| CN | 102224574 A | 10/2011 |

(Continued)

OTHER PUBLICATIONS

U.S. Office Action dated Sep. 3, 2015 issued in U.S. Appl. No. 14/465,610.
(Continued)

*Primary Examiner* — Brook Kebede
(74) *Attorney, Agent, or Firm* — Weaver Austin Villeneauve & Sampson LLP

(57) ABSTRACT

The methods, systems and apparatus described herein relate to chamber conditioning for remote plasma processes, in particular remote nitrogen-based plasma processes. Certain implementations of the disclosure relate to remote plasma inhibition processes for feature fill that include chamber conditioning. Embodiments of the disclosure relate to exposing remote plasma processing chambers to fluorine species prior to nitrogen-based remote plasma processing of substrates such as semiconductor wafers. Within-wafer uniformity and wafer-to-wafer uniformity is improved.

21 Claims, 12 Drawing Sheets

(51) Int. Cl.

| | | |
|---|---|---|
| *H01L 21/285* | (2006.01) | |
| *C23C 16/08* | (2006.01) | |
| *C23C 16/455* | (2006.01) | |
| *H01J 37/32* | (2006.01) | |
| *H01L 21/67* | (2006.01) | |
| *H01L 21/687* | (2006.01) | |

(52) U.S. Cl.
CPC .... *C23C 16/45565* (2013.01); *H01J 37/3211* (2013.01); *H01J 37/3244* (2013.01); *H01J 37/32183* (2013.01); *H01J 37/32357* (2013.01); *H01L 21/28562* (2013.01); *H01L 21/67161* (2013.01); *H01L 21/68764* (2013.01); *H01L 21/68771* (2013.01); *H01J 2237/3321* (2013.01)

(58) Field of Classification Search
USPC .................................................. 438/618, 758
See application file for complete search history.

(56) References Cited

U.S. PATENT DOCUMENTS

| | | | |
|---|---|---|---|
| 4,892,753 A | 1/1990 | Wang et al. | |
| 5,112,439 A | 5/1992 | Reisman et al. | |
| 5,250,467 A | 10/1993 | Somekh et al. | |
| 5,370,739 A | 12/1994 | Foster et al. | |
| 5,391,394 A | 2/1995 | Hansen | |
| 5,407,698 A | 4/1995 | Emesh | |
| 5,489,552 A | 2/1996 | Merchant et al. | |
| 5,605,859 A | 2/1997 | Lee | |
| 5,647,953 A | 7/1997 | Williams et al. | |
| 5,654,475 A | 8/1997 | Vassiliou et al. | |
| 5,719,410 A | 2/1998 | Suehiro et al. | |
| 5,785,796 A | 7/1998 | Lee | |
| 5,804,249 A | 9/1998 | Sukharev et al. | |
| 5,824,375 A | 10/1998 | Gupta | |
| 5,866,483 A | 2/1999 | Shiau et al. | |
| 5,963,827 A | 10/1999 | Enomoto et al. | |
| 5,963,833 A | 10/1999 | Thakur | |
| 5,970,383 A | 10/1999 | Lee | |
| 6,001,729 A | 12/1999 | Shinriki et al. | |
| 6,013,575 A | 1/2000 | Itoh | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,071,573 A | 6/2000 | Koemtzopoulos et al. | |
| 6,100,193 A | 8/2000 | Suehiro et al. | |
| 6,107,200 A | 8/2000 | Takagi et al. | |
| 6,121,161 A | 9/2000 | Rossman et al. | |
| 6,121,164 A | 9/2000 | Yieh et al. | |
| 6,143,082 A | 11/2000 | McInerney et al. | |
| 6,184,158 B1 | 2/2001 | Shufflebotham et al. | |
| 6,355,558 B1 | 3/2002 | Dixit et al. | |
| 6,416,577 B1 | 7/2002 | Suntoloa et al. | |
| 6,432,830 B1 | 8/2002 | Merry | |
| 6,449,521 B1 | 9/2002 | Gupta | |
| 6,503,843 B1 | 1/2003 | Xia et al. | |
| 6,566,250 B1 | 5/2003 | Tu et al. | |
| 6,626,188 B2 | 9/2003 | Fitzsimmons et al. | |
| 6,696,337 B2 | 2/2004 | Asano et al. | |
| 6,749,098 B2 | 6/2004 | Roier et al. | |
| 6,815,007 B1 | 11/2004 | Yoo et al. | |
| 6,819,969 B2 | 11/2004 | Lee et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 7,005,372 B2 | 2/2006 | Levy et al. | |
| 7,118,779 B2 | 10/2006 | Verghese et al. | |
| 7,141,494 B2 | 11/2006 | Lee et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 | 10/2007 | Li et al. | |
| 7,355,254 B2 | 4/2008 | Datta et al. | |
| 7,501,343 B2 | 3/2009 | Byun et al. | |
| 7,501,344 B2 | 3/2009 | Byun et al. | |
| 7,601,639 B2 | 10/2009 | Pavone et al. | |
| 7,655,567 B1 | 2/2010 | Gao et al. | |
| 7,691,749 B2 | 4/2010 | Levy et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,101,531 B1 | 1/2012 | Li et al. | |
| 8,119,527 B1 | 2/2012 | Chandrashekar et al. | |
| 8,124,531 B2 | 2/2012 | Chandrashekar et al. | |
| 8,163,087 B2 | 4/2012 | Faguet et al. | |
| 8,258,057 B2 | 9/2012 | Kuhn et al. | |
| 8,293,658 B2 | 10/2012 | Shero et al. | |
| 8,409,985 B2 | 4/2013 | Chan et al. | |
| 8,435,894 B2 | 5/2013 | Chandrashekar et al. | |
| 8,551,885 B2 | 10/2013 | Chen et al. | |
| 8,835,317 B2 | 9/2014 | Chandrashekar et al. | |
| 8,853,080 B2 | 10/2014 | Guan et al. | |
| 8,975,184 B2 | 3/2015 | Chen et al. | |
| 9,228,259 B2 | 1/2016 | Haukka et al. | |
| 9,240,347 B2 | 1/2016 | Chandrashekar et al. | |
| 9,328,416 B2 | 5/2016 | Dhas et al. | |
| 9,349,637 B2 | 5/2016 | Na et al. | |
| 9,653,353 B2 | 5/2017 | Chandrashekar et al. | |
| 9,745,658 B2 | 8/2017 | Kang et al. | |
| 9,748,137 B2 | 8/2017 | Lai et al. | |
| 9,828,672 B2 | 11/2017 | Varadarajan et al. | |
| 2001/0006835 A1 | 7/2001 | Kim et al. | |
| 2001/0044041 A1 | 11/2001 | Badding et al. | |
| 2002/0037630 A1 | 3/2002 | Agarwal et al. | |
| 2002/0073922 A1 | 6/2002 | Frankel et al. | |
| 2002/0090811 A1 | 7/2002 | Kim et al. | |
| 2002/0132472 A1 | 9/2002 | Park | |
| 2002/0155722 A1 | 10/2002 | Satta et al. | |
| 2002/0177316 A1 | 11/2002 | Miller et al. | |
| 2003/0013314 A1 | 1/2003 | Ying et al. | |
| 2003/0082902 A1 | 5/2003 | Fukui et al. | |
| 2003/0091870 A1 | 5/2003 | Bhowmik et al. | |
| 2003/0129828 A1 | 7/2003 | Cohen et al. | |
| 2003/0190802 A1 | 10/2003 | Wang et al. | |
| 2003/0194850 A1 | 10/2003 | Lewis et al. | |
| 2003/0203123 A1* | 10/2003 | Shang ................ C23C 14/3407 427/569 |
| 2004/0023516 A1 | 2/2004 | Londergan et al. | |
| 2004/0079632 A1 | 4/2004 | Ahmad et al. | |
| 2004/0134427 A1 | 7/2004 | Derderian et al. | |
| 2004/0142557 A1 | 7/2004 | Levy et al. | |
| 2004/0149386 A1* | 8/2004 | Numasawa ........ C23C 16/4405 156/345.43 |
| 2004/0206267 A1 | 10/2004 | Sambasivan et al. | |
| 2004/0245091 A1 | 12/2004 | Karim et al. | |
| 2005/0031786 A1 | 2/2005 | Lee et al. | |
| 2005/0059236 A1 | 3/2005 | Nishida et al. | |
| 2005/0130427 A1 | 6/2005 | Won et al. | |
| 2005/0179141 A1 | 8/2005 | Yun et al. | |
| 2005/0214455 A1 | 9/2005 | Li et al. | |
| 2005/0221020 A1 | 10/2005 | Fukiage | |
| 2006/0046470 A1 | 3/2006 | Becknell et al. | |
| 2006/0075966 A1 | 4/2006 | Chen et al. | |
| 2006/0093756 A1 | 5/2006 | Rajagopalan et al. | |
| 2006/0094238 A1 | 5/2006 | Levy et al. | |
| 2006/0145190 A1 | 7/2006 | Salzman et al. | |
| 2006/0189171 A1 | 8/2006 | Chua et al. | |
| 2006/0280868 A1 | 12/2006 | Kato et al. | |
| 2007/0099420 A1 | 5/2007 | Dominguez et al. | |
| 2007/0166989 A1 | 7/2007 | Fresco et al. | |
| 2007/0201016 A1 | 8/2007 | Song et al. | |
| 2007/0264105 A1 | 11/2007 | Pharand et al. | |
| 2008/0054468 A1 | 3/2008 | Choi et al. | |
| 2008/0094775 A1 | 4/2008 | Sneh et al. | |
| 2008/0118663 A1 | 5/2008 | Choi et al. | |
| 2008/0286982 A1 | 11/2008 | Li et al. | |
| 2008/0302281 A1 | 12/2008 | Bernard et al. | |
| 2009/0045517 A1 | 2/2009 | Sugiura et al. | |

(56) References Cited

U.S. PATENT DOCUMENTS

| | | |
|---|---|---|
| 2009/0053426 A1 | 2/2009 | Lu et al. |
| 2009/0053893 A1 | 2/2009 | Khandelwal et al. |
| 2009/0160030 A1 | 6/2009 | Tuttle |
| 2009/0163025 A1 | 6/2009 | Humayun et al. |
| 2009/0183984 A1 | 7/2009 | Sakuma et al. |
| 2009/0197401 A1 | 8/2009 | Li et al. |
| 2009/0242511 A1 | 10/2009 | Shimazu et al. |
| 2009/0278116 A1 | 11/2009 | Yamate |
| 2009/0315154 A1 | 12/2009 | Kirby et al. |
| 2009/0325391 A1 | 12/2009 | De Vusser et al. |
| 2010/0048028 A1 | 2/2010 | Rasheed et al. |
| 2010/0055904 A1 | 3/2010 | Chen et al. |
| 2010/0072623 A1 | 3/2010 | Prindle et al. |
| 2010/0130002 A1 | 5/2010 | Dao et al. |
| 2010/0159694 A1 | 6/2010 | Chandrashekar et al. |
| 2010/0267230 A1 | 10/2010 | Chandrashekar et al. |
| 2010/0267235 A1 | 10/2010 | Chen et al. |
| 2011/0070380 A1 | 3/2011 | Shero et al. |
| 2011/0151142 A1 | 6/2011 | Seamons et al. |
| 2011/0151670 A1 | 6/2011 | Lee et al. |
| 2011/0159690 A1 | 6/2011 | Chandrashekar et al. |
| 2011/0233778 A1 | 9/2011 | Lee et al. |
| 2011/0236594 A1 | 9/2011 | Haverkamp et al. |
| 2011/0256726 A1 | 10/2011 | LaVoie et al. |
| 2011/0315186 A1 | 12/2011 | Gee et al. |
| 2012/0009785 A1 | 1/2012 | Chandrashekar et al. |
| 2012/0077342 A1 | 3/2012 | Gao et al. |
| 2012/0097330 A1 | 4/2012 | Iyengar et al. |
| 2012/0115329 A1 | 5/2012 | Chandrashekar et al. |
| 2012/0294874 A1 | 11/2012 | Macary et al. |
| 2013/0062677 A1 | 3/2013 | Li et al. |
| 2013/0064973 A1 | 3/2013 | Chen et al. |
| 2013/0089988 A1 | 4/2013 | Wang et al. |
| 2013/0171822 A1 | 7/2013 | Chandrashekar et al. |
| 2013/0260555 A1 | 10/2013 | Zope et al. |
| 2013/0302980 A1* | 11/2013 | Chandrashekar .................. H01L 21/76877 438/666 |
| 2013/0330926 A1 | 12/2013 | Chandrashekar et al. |
| 2014/0030889 A1 | 1/2014 | Chen et al. |
| 2014/0073135 A1 | 3/2014 | Guan et al. |
| 2014/0106083 A1 | 4/2014 | Wu et al. |
| 2014/0120738 A1 | 5/2014 | Jung et al. |
| 2014/0209026 A1 | 7/2014 | LaVoie et al. |
| 2014/0295670 A1 | 10/2014 | Shih et al. |
| 2014/0349477 A1 | 11/2014 | Chandrashekar et al. |
| 2015/0024592 A1 | 1/2015 | Chandrashekar et al. |
| 2015/0056803 A1 | 2/2015 | Chandrashekar et al. |
| 2015/0147482 A1 | 5/2015 | Kang et al. |
| 2015/0203967 A1 | 7/2015 | Dhas et al. |
| 2015/0221553 A1 | 8/2015 | Ouye |
| 2015/0294906 A1 | 10/2015 | Wu et al. |
| 2015/0361547 A1* | 12/2015 | Lin ..................... C23C 16/4405 134/1.1 |
| 2016/0056074 A1 | 2/2016 | Na et al. |
| 2016/0056077 A1 | 2/2016 | Lai et al. |
| 2016/0093528 A1 | 3/2016 | Chandrashekar et al. |
| 2016/0190008 A1 | 6/2016 | Chandrashekar et al. |
| 2016/0281230 A1 | 9/2016 | Varadarajan et al. |
| 2016/0293467 A1 | 10/2016 | Caveney et al. |
| 2016/0300713 A1 | 10/2016 | Cui et al. |
| 2016/0343612 A1 | 11/2016 | Wang et al. |
| 2017/0278749 A1 | 9/2017 | Chandrashekar et al. |
| 2017/0314128 A1 | 11/2017 | Kang et al. |
| 2017/0365513 A1 | 12/2017 | Yang et al. |

FOREIGN PATENT DOCUMENTS

| | | |
|---|---|---|
| CN | 103125013 A | 5/2013 |
| CN | 103243310 A | 8/2013 |
| JP | H2-187031 A | 7/1990 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 09-022896 A | 1/1997 |
| JP | 2002-016066 A | 1/2002 |
| JP | 2007-251164 | 9/2007 |
| JP | 2008-177577 | 7/2008 |
| JP | 2010-251760 A | 11/2010 |
| JP | 2011-035366 A | 2/2011 |
| KR | 10-2001-0030488 | 4/2001 |
| KR | 10-2006-0087844 | 8/2006 |
| KR | 10-2007-0054100 | 5/2007 |
| KR | 10-2010-0067065 | 6/2010 |
| WO | WO 2013/148444 | 10/2013 |
| WO | WO 2013/148880 | 10/2013 |
| WO | WO 2014/105477 A1 | 7/2014 |

OTHER PUBLICATIONS

U.S. Notice of Allowance dated Jan. 14, 2016 issued in U.S. Appl. No. 14/465,610.
U.S. Office Action dated Nov. 1, 2016 issued in U.S. Appl. No. 14/873,152.
U.S. Office Action dated May 25, 2016 issued in U.S. Appl. No. 14/866,621.
U.S. Notice of Allowance dated Oct. 21, 2016 issued in U.S. Appl. No. 14/866,621.
U.S. Office Action dated Dec. 10, 2015 issued in U.S. Appl. No. 14/089,653.
U.S. Office Action dated May 13, 2016 issued in U.S. Appl. No. 14/089,653.
U.S. Final Office Action dated Oct. 28, 2016 issued in U.S. Appl. No. 14/089,653.
U.S. Office Action, dated Aug. 17, 2015, issued in U.S. Appl. No. 14/158,536.
U.S. Notice of Allowance, dated Jan. 11, 2016, issued in U.S. Appl. No. 14/158,536.
U.S. Office Action, dated Nov. 18, 2016, issued in U.S. Appl. No. 14/712,167.
Cunge et al. (2005) "New chamber walls conditioning and cleaning strategies to improve the stability of plasma processes," *Plasma Sources Sci. Technol.* 14:509-609.
Cunge et al. (2005) "Plasma-wall interactions during silicon etching processes in high-density $HBr/Cl_2/O_2$ plasmas," *Plasma Sources Sci. Technol.* 14:S42-S52.
Juárez et al. (2009) "Low temperature deposition: properties of $SiO_2$ films from TEOS and ozone by APCVD system," XIX Latin American Symposium on Solid State Physics (SLAFES XIX). *Journal of Physics: Conference Series* 167(012020) pp. 1-6.
Kang et al. (Jul./Aug. 2005) "Evaluation of silicon oxide cleaning using $F_2$/Ar remote plasma processing," *J. Vac. Sci. Technol. A* 23(4):911-916.
Kim et al. (1991) "Recombination of O, N, and H Atoms on Silica. Kinetics and Mechanism," *Langmuir*, 7(12):2999-3005.
Kim et al. (2015) "Investigation of Plasma Enhanced Chemical Vapor Deposition Chamber Mismatching by Photoluminescence and Raman Spectroscopy," *ECS Journal of Solid State Science and Technology*, 4(8)P314-P318.
Klimecky et al. (May/Jun. 2003) "Compensation for transient chamber wall condition using real-time plasma density feedback control in an inductively coupled plasma etcher," *Journal Vac. Sci. Technol. A*, 21(3):706-717.
Knoops et al. (2010) "Conformality of Plasma-Assisted ALD: Physical Processes and Modeling," *Journal of The Electrochemical Society*, 157(12):G241-G249.
Nakagawa, Takahide (May 1991) "Effect of Coating on the Plasma Chamber Wall in RIKEN Electron Cyclotron Resonance Ion Source," *Japanese Journal of Applied Physics*, 30(5B)L930-L932.
U.S. Notice of Allowance dated Jan. 23, 2017 issued in U.S. Appl. No. 14/089,653.
U.S. Notice of Allowance dated Jun. 1, 2017 issued in U.S. Appl. No. 14/089,653.
U.S. Final Office Action, dated Apr. 20, 2017, issued in U.S. Appl. No. 14/712,167.

(56) References Cited

OTHER PUBLICATIONS

U.S. Notice of Allowance, dated Aug. 18, 2017, issued in U.S. Appl. No. 14/712,167.
U.S. Office Action, dated Mar. 24, 2017, issued in U.S. Appl. No. 14/683,022.
U.S. Final Office Action, dated Nov. 3, 2017, issued in U.S. Appl. No. 14/683,022.
Chinese First Office Action, dated Sep. 5, 2016, issued in Application No. CN 201410686823.4.
Chinese Second Office Action, dated May 8, 2017, issued in Application No. CN 201410686823.4.
U.S. Notice of Allowance dated Apr. 27, 2017 issued in U.S. Appl. No. 14/873,152.
U.S. Office Action dated May 18, 2017 issued in U.S. Appl. No. 14/866,621.
U.S. Final Office Action dated Oct. 19, 2017 issued in U.S. Appl. No. 14/866,621.
U.S. Notice of Allowance dated Feb. 13, 2018 issued in U.S. Appl. No. 14/866,621.
U.S. Office Action dated Dec. 15, 2017 issued in U.S. Appl. No. 15/156,129.
U.S. Office Action dated Nov. 25, 2011 issued in U.S. Appl. No. 13/016,656.
U.S. Notice of Allowance dated Jan. 9, 2012 issued in U.S. Appl. No. 13/016,656.
U.S. Office Action, dated Jan. 15, 2015, issued in U.S. Appl. No. 13/774,350.
U.S. Office Action, dated Oct. 8, 2015, issued in U.S. Appl. No. 13/774,350.
U.S. Office Action, dated Jun. 2, 2016, issued in U.S. Appl. No. 13/774,350.
U.S. Final Office Action, dated Jan. 18, 2017, issued in U.S. Appl. No. 13/774,350.
U.S. Office Action, dated Sep. 20, 2017, issued in U.S. Appl. No. 13/774,350.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Dec. 12, 2017, issued in U.S. Appl. No. 15/482,271.
Chinese first Office Action dated Dec. 12, 2017 issued in Application No. CN 201510518752.1.
Chinese first Office Action dated Dec. 20, 2017 issued in Application No. CN 201510644832.1.
Korean Provisional Rejection dated Nov. 16, 2012, issued in Application No. KR 2011-0068603.
Korean Office Action dated Sep. 26, 2016, issued in Application No. KR 10-2013-0054726.
Korean Final Office Action dated May 30, 2017, issued in Application No. KR 10-2013-0054726.
Korean Final Office Action dated Sep. 19, 2017, issued in Application No. KR 10-2013-0054726.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
Chinese First Office Action dated Feb. 26, 2016, issued in CN 201380022648.2.
Japanese Office Action dated Jan. 24, 2017, issued in JP 2015-514160.
Taiwan Office Action and Search Report dated Nov. 22, 2016 issued in Application No. TW 102110937.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
U.S. Appl. No. 15/794,786, filed Oct. 26, 2017, Varadarajan et al.
U.S. Appl. No. 15/673,320, filed Aug. 9, 2017, Jandl et al.

\* cited by examiner

CHAMBER CONDITIONING FOR REMOTE PLASMA PROCESS

BACKGROUND

Filling contact holes, trench lines, and other features with various materials is an integral part of semiconductor fabrication processes. For example, to form horizontal interconnects, vias between adjacent metal layers, contacts between first metal layers and devices, metals such as tungsten may be deposited using chemical vapor deposition (CVD) techniques. In a conventional deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing materials into small and high aspect ratio features may cause formation of voids and seams inside the filled features. Large seams may lead to high resistance, contamination, loss of filled materials, and otherwise degrade performance of integrated circuits. For example, a seam may extend close to the field region after filling process and then open during chemical-mechanical planarization. Similarly, a void may cause problems with integration and performance.

SUMMARY

One aspect of the disclosure relates to a method of performing a conditioning process on a remote plasma processing chamber, the conditioning process including introducing a fluorine-containing gas to a plasma generator to generate a fluorine-containing conditioning plasma; inletting the fluorine-containing conditioning plasma to the remote plasma processing chamber, wherein the remote plasma processing chamber includes a substrate support and a showerhead and the showerhead is disposed between the substrate support and the plasma generator and wherein, during the conditioning process, no fabrication substrate is present in the remote plasma processing chamber; after performing the conditioning process, introducing a fabrication substrate to the remote plasma processing chamber; and exposing the fabrication substrate to a remotely generated nitrogen-based plasma. In some embodiments, the fabrication substrate includes one or more features to be filled.

In some embodiments, the remotely generated nitrogen-based plasma is generated from $N_2$ gas. In some embodiments, the remotely generated nitrogen-based plasma is generated from a nitrogen-containing compound and the conditioning process further includes introducing the nitrogen-containing compound to the plasma generator to generate a fluoride-free nitrogen-based conditioning plasma, and inletting the fluoride-free nitrogen-based conditioning plasma to the remote plasma processing chamber.

In some embodiments, the method further includes sequentially introducing one or more additional fabrication substrates to the remote plasma processing chamber and exposing each to a remotely generated nitrogen-based plasma. For example, at least three fabrication substrates may be introduced to the remote plasma processing chamber prior to performing another conditioning process.

In some embodiments, the remotely generated nitrogen-based plasma selectively inhibits nucleation near a feature opening with respect to the interior of the feature. In some such embodiments, the method may further include selectively depositing tungsten or cobalt in the feature in the interior of the feature with respect to near the feature opening. In some embodiments, the conditioning process may further include forming a fluorine-containing layer on one or more chamber components. In some embodiments, the conditioning process may further include forming an aluminum fluoride layer on one or more chamber components.

Another aspect of the disclosure relates to a method including performing multiple conditioning and processing cycles to sequentially process a plurality of substrates in a remote plasma processing chamber. Each cycle may include a) performing a conditioning process including: i) introducing a fluorine-containing gas to a plasma generator to generate a fluorine-containing conditioning plasma; and ii) inletting the fluorine-containing conditioning plasma to the remote plasma processing chamber, wherein the remote plasma processing chamber includes a substrate support and a showerhead and the showerhead is disposed between the substrate support and the plasma generator and wherein, during the conditioning process, no fabrication substrate is present in the remote plasma processing chamber; b) after the conditioning process and prior to repeating the conditioning process, performing a plurality of nitrogen plasma exposure processes each of which includes: i) introducing a fabrication substrate to the remote plasma processing chamber; ii) exposing the fabrication substrate to a remotely generated nitrogen-based plasma; and iii) removing the fabrication substrate form the remote plasma processing chamber.

In some embodiments, the remotely generated nitrogen-based plasma is generated from $N_2$ gas. In some embodiments, the remotely generated nitrogen-based plasma is generated from a nitrogen-containing compound and the conditioning process further includes introducing the nitrogen-containing compound to the plasma generator to generate a fluoride-free nitrogen-based conditioning plasma, and inletting the fluoride-free nitrogen-based conditioning plasma to the remote plasma processing chamber. In some embodiments, the method further includes sequentially introducing one or more additional fabrication substrates to the remote plasma processing chamber and exposing each to a remotely generated nitrogen-based plasma. For example, at least three fabrication substrates may be introduced to the remote plasma processing chamber prior to performing another conditioning process. In some embodiments, the remotely generated nitrogen-based plasma selectively inhibits nucleation near a feature opening with respect to the interior of the feature. In some such embodiments, the method may further include selectively depositing tungsten or cobalt in the feature in the interior of the feature with respect to near the feature opening. In some embodiments, the conditioning process may further include forming a fluorine-containing layer on one or more chamber components. In some embodiments, the conditioning process may further include forming an aluminum fluoride layer on one or more chamber components.

Another aspect of the disclosure relates to a method of conditioning a remote plasma processing chamber by exposing it to atomic fluorine; after conditioning the remote plasma processing chamber, introducing a substrate having one or more features to the remote plasma processing chamber, each feature comprising a feature opening; exposing the substrate to nitrogen radicals; selectively inhibiting nucleation on surfaces of the one or more features that are at or near the feature openings such that a differential inhibition profile in each feature is formed; an depositing material in the feature in accordance with the differential inhibition profile. Examples of materials include tungsten and cobalt. In some embodiments, the material is deposited in the remote plasma processing chamber. In some embodiments, the material is deposited in a chamber separate from the remote plasma processing chamber.

These and other aspects of the disclosed embodiments are further described in more detail with reference to the corresponding drawings.

DETAILED DESCRIPTION

Figure 1:
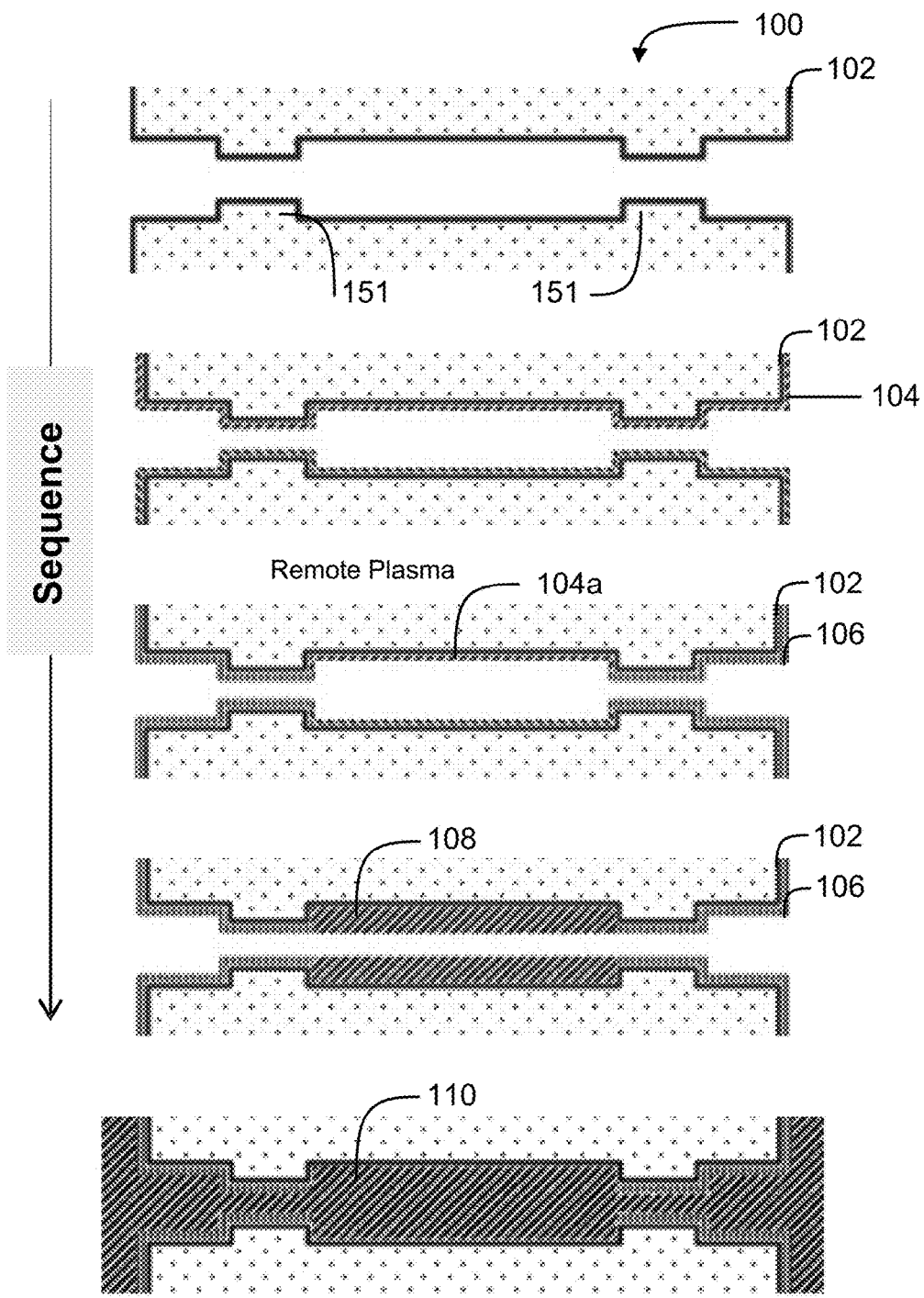
FIG. 1 shows an example of a schematic representation of feature fill sequence that may employ a remote plasma process.

In the following description, numerous specific details are set forth in order to provide a thorough understanding of the disclosed embodiments. The disclosed embodiments may be practiced without some or all of these specific details. In other instances, well known process operations have not been described in detail to not unnecessarily obscure the disclosed embodiments. While the disclosed embodiments will be described in conjunction with the specific embodiments, it will be understood that it is not intended to limit the disclosed embodiments.

The methods, systems and apparatus described herein relate to chamber conditioning for remote plasma processes, in particular remote nitrogen-based plasma processes. Certain implementations of the disclosure relate to remote plasma inhibition processes for feature fill that include chamber conditioning. However, it will be appreciated that the chamber conditioning methods described herein may be implemented for various other applications.

Filling features with materials may cause formation of voids and seams inside the filled features. A void is region in the feature that is left unfilled. A void can form, for example, when the deposited material forms a pinch point within the feature, sealing off an unfilled space within the feature preventing reactant entry and deposition. A seam is an elongated region in a feature that may be characterized by an elongated void, a series of smaller voids, or by a grain boundary.

There are multiple potential causes for void and seam formation. One is an overhang at the feature opening. An overhang may be formed by a previous layer (e.g., a diffusion barrier layer) or in the initial stages of deposition of the fill material. Another cause of void or seam formation is curved or bowed side walls of feature holes, which are also referred to as bowed features. In a feature having an overhang or in a bowed feature, the cross-sectional dimension of the cavity to be filled near the opening is smaller than that inside the feature. Constrictions within a feature also present challenges for fill.

Even if void-free fill is achieved, a seam may run through the center axis of a via, trench, line or other feature. This is because growth can begin at a side wall and continue until the grains meet with growth from the opposite side wall. This seam can allow for trapping of impurities including fluorine-containing compounds such as hydrofluoric acid (HF). During chemical mechanical planarization (CMP), coring can propagate from the seam. According to various embodiments, the methods described herein can reduce or eliminate void and seam formation.

Embodiments of the disclosure involve preferentially inhibiting film growth at a part of feature. This preferential inhibition, which may also be referred to as selective inhibition, selective passivation, differential inhibition, or differential passivation, involves inhibiting nucleation at portion of the feature while not inhibiting nucleation (or inhibiting nucleation to a lesser extent) on the remainder of the feature. For example, in some embodiments, a feature is preferentially inhibited at a feature opening, while nucleation further inside the feature is not inhibited. In some embodiments, a feature is preferentially inhibited at a feature constriction, while nucleation further inside a feature is not inhibited.

Selective inhibition is described further below, and can involve, for example, selectively exposing a portion of the feature to activated species of a plasma. In certain embodiments, for example, a feature opening is selectively exposed to a plasma generated from molecular nitrogen gas ($N_2$). As discussed further below, a desired inhibition profile in a feature can be formed by appropriately selecting one or more of inhibition chemistry, substrate bias power, plasma power, process pressure, exposure time, and other process parameters.

FIG. 1 shows an example of a schematic representation of feature fill sequence that may employ a remote plasma process. In the example of FIG. 1, tungsten (W) deposition to fabricate a word line (WL) is illustrated. A WL structure 100 is provided with a liner layer surface 102. The liner layer surface 102 may be for example, titanium nitride (TiN) or tungsten nitride (WN). Next, a W nucleation layer 104 is conformally deposited on the liner layer 102 throughout the structure 100. Note that in some processes, this operation of depositing a conformal nucleation layer may be omitted. Next, the structure is exposed to an inhibition chemistry to selectively inhibit portions 106 of the structure 100. In this example, the portions 104a beyond the pillar constrictions 151 are not inhibited. As indicated in the figure, inhibition involves exposure to a remotely-generated plasma generated from a gas such as $N_2$, forming gas ($N_2+H_2$), or $NH_3$.

Next, a chemical vapor deposition (CVD) process is performed to selectively deposit tungsten in accordance with the inhibition profile: bulk tungsten 108 is preferentially deposited on the non-inhibited portions 104a of the nucleation layer, such that hard-to-fill regions behind constrictions are filled, while not deposited on the inhibited portions 106. The remainder of the feature is then filled with bulk tungsten 110. The same CVD process used to selectively deposit tungsten may be used to remainder of the feature, or a different CVD process using a different chemistry or process conditions and/or performed after a nucleation layer is deposited may be used.

FIG. 1 is an example of a feature fill process that may employ a nitrogen-based remote plasma. Other examples may be found in U.S. Patent Publication Nos. 20130171822, 20160056077, and 20160190008 and U.S. Pat. No. 9,349,637, which are incorporated by reference herein. In particular, U.S. Patent Publications Nos. 2013017182 and 20160190008 are incorporated by reference for the purpose of describing methods of tungsten feature fill using nitrogen-based remote plasmas and U.S. Patent Publication 20160056077 and U.S. Pat. No. 9,349,637 are incorporated by reference for the purpose of describing methods of cobalt feature fill using nitrogen-based remote plasmas. Embodiments of the disclosure include feature fill of these and other materials using nitrogen-based remote inhibition processes.

Figure 2:
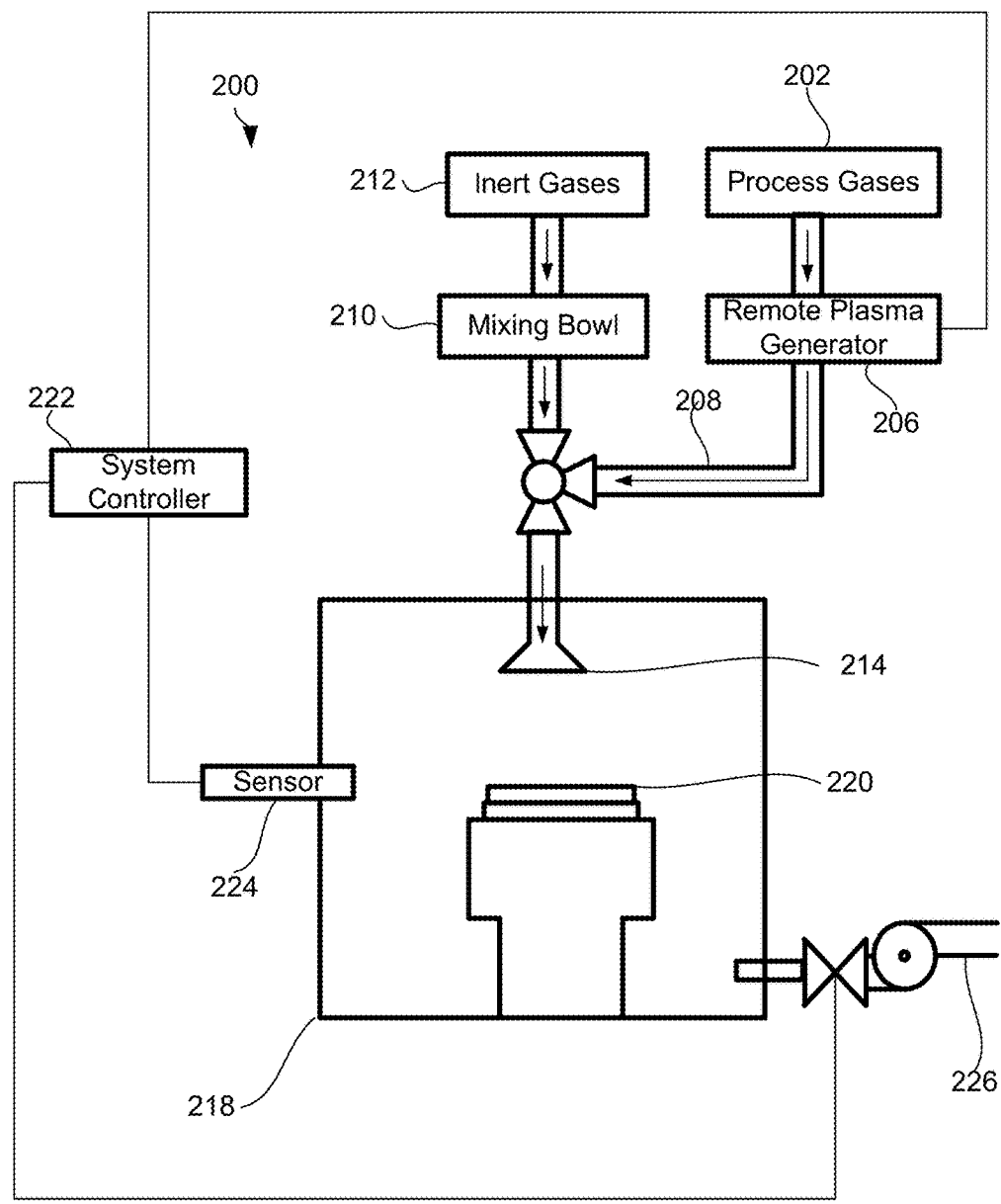
FIGS. 2 and 3 show schematic examples of apparatuses for remote plasma processing.
Figure 3:
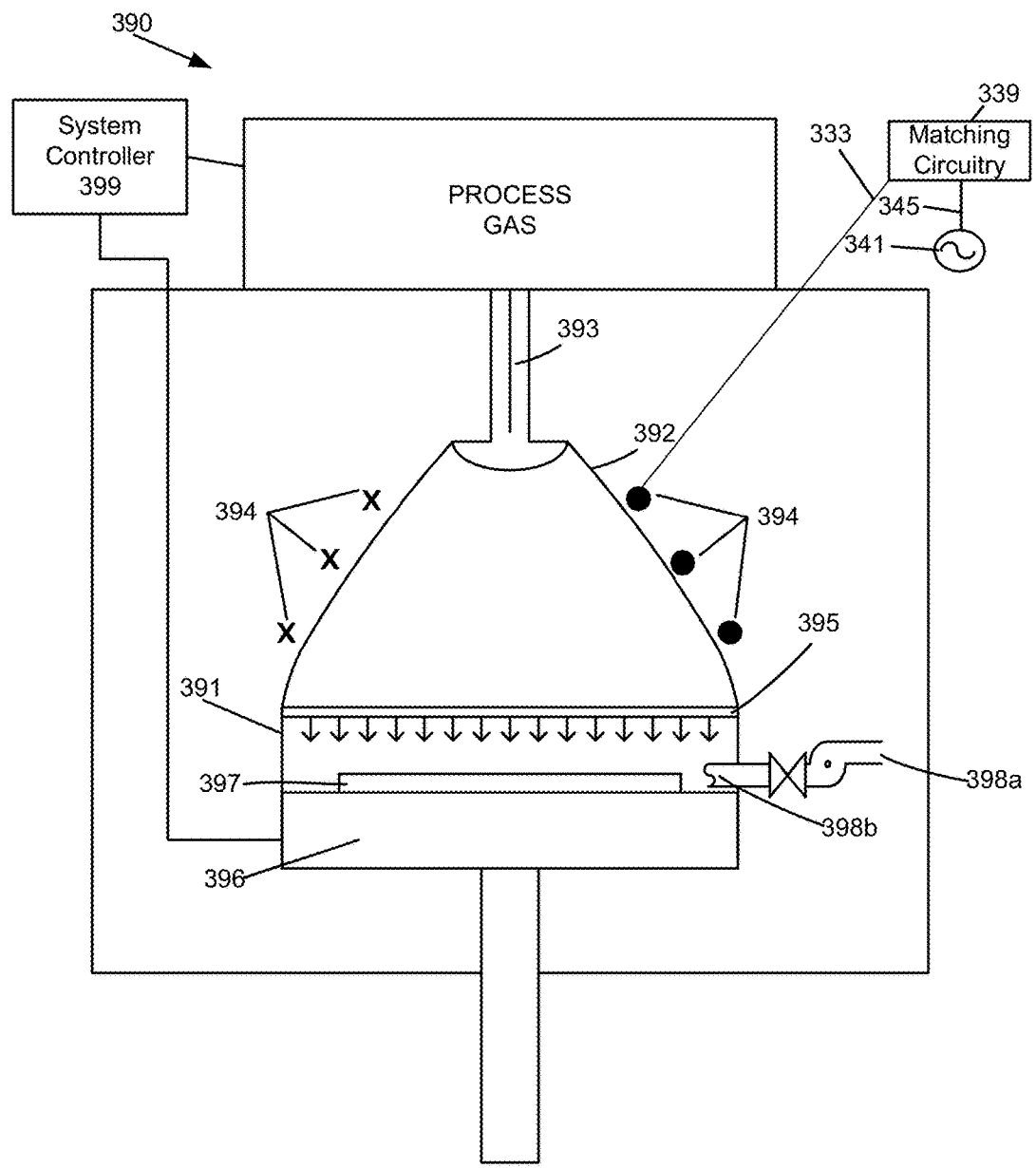

FIGS. 2 and 3 show schematic examples of apparatuses for remote plasma processing. First, in FIG. 2, an apparatus 200 includes a chamber 218 with a pedestal 220, a showerhead 214, and a remote plasma generator 206. The apparatus may include an in-situ plasma generator (not shown) in some embodiments. The apparatus 200 also includes a system controller 222 to receive input and/or supply control signals. System controllers are described further below.

Gases (e.g., a nitrogen-based gas, a fluorine-containing gas, inert gases such as argon, helium, etc.) are supplied to the remote plasma generator 206 as a process gas from one or more sources 202, which may be one or more storage tanks. Any suitable remote plasma generator may be used for activating the process gas before introducing it into the chamber 218. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied process gas.

In certain embodiments, a process gas is flown from the remote plasma generator 206 through a connecting line 208 into the chamber 218, where the mixture is distributed through the showerhead 214. In certain embodiments, one or more inert gas sources 212 may be connected to a mixing bowl 210 and then mixed downstream of the remote plasma generator 206 with the plasma species.

The chamber 218 may include a sensor 224 for sensing various process parameters, such as degree of deposition or etching, concentrations, pressure, temperature, and others. The sensor 224 may provide information on chamber conditions during the process to the system controller 222. Examples of the sensor 224 include mass flow controllers, pressure sensors, thermocouples, and others. The sensor 224 may also include an infra-red detector or optical detector to monitor presence of gases in the chamber and control measures.

Various volatile species may be evacuated from the chamber 218. Moreover, processing is performed at certain predetermined pressure levels in the chamber 218. A vacuum outlet 226, which may be a vacuum pump may be used to control pressure and evacuate gases as appropriate.

Plasma species that are generated in the remote plasma generator may include ionic species and neutral species such as atoms and radicals. The showerhead 214 may effectively stop the flow of ionic species, such that only neutral species enter the chamber 218. The showerhead may be an aluminum (Al) showerhead or an Al-containing showerhead.

FIG. 3 shows another example apparatus for remote plasma processing that may in accordance with certain disclosed embodiments. FIG. 3 schematically shows a cross-sectional view of an inductively coupled plasma etching apparatus 390 appropriate for implementing certain embodiments herein, an example of which is a ALTUS® Max ExtremeFill™ reactor, produced by Lam Research Corp. of Fremont, Calif. Although ICP reactors are described herein, in some embodiments, it should be understood that capacitively coupled plasma reactors may also be used.

The inductively coupled plasma apparatus 390 includes an overall process chamber structurally defined by chamber walls 391 and a dome 392 for igniting a plasma. The chamber walls 391 may be fabricated from stainless steel or Al. Elements for plasma generation include a coil 394, which is positioned around the dome 392 and above the showerhead 395. In some embodiments, a coil is not used. The coil 394 is fabricated from an electrically conductive material and includes at least one complete turn. The example of a coil 394 shown in FIG. 3 includes three turns. The cross sections of coil 394 are shown with symbols, and coils having an "X" extend rotationally into the page, while coils having a "●" extend rotationally out of the page. Elements for plasma generation also include an RF power supply 341 configured to supply RF power to the coil 394. In general, the RF power supply 341 is connected to matching circuitry 339 through a connection 345. The matching circuitry 339 is connected to the coil 394 through a connection 333. In this manner, the RF power supply 341 is connected to the coil 394. Radio frequency power is supplied from the RF power supply 341 to the coil 394 to cause an RF current to flow through the coil 394. The RF current flowing through the coil 394 generates an electromagnetic field about the coil 494. The electromagnetic field generates an inductively coupled plasma within the dome 392, generating ionic species and neutral species such as radicals.

RF power supply 341 may provide RF power of any suitable frequency. In some embodiments, RF power supply 341 may be configured to control high- and low-frequency RF power sources independently of one another.

A showerhead 395 distributes process gases toward a substrate 397. In the embodiment shown in FIG. 3, the substrate 397 is located beneath showerhead 395 and is shown resting on a pedestal 396. Showerhead 395 may have any suitable shape, and may have any suitable number and arrangement of ports for distributing process gases to substrate 397. As in the example of FIG. 2, the showerhead 395 may act as a filter for ions, allowing only neutral species to reach the substrate 397. The showerhead may be an Al or Al-containing showerhead. A pedestal 396 is configured to receive and hold the substrate 397.

Gases (e.g., nitrogen-containing gases, inert gases, or fluorine-containing gases) may be flowed into the process chamber through one or more main gas flow inlets 393 positioned in the dome and/or through one or more side gas flow inlets (not shown). Likewise, though not explicitly shown, similar gas flow inlets may be used to supply process gases to a capacitively coupled plasma processing chamber. In some embodiments for a capacitively coupled plasma processing chamber, gas may be injected through a showerhead via the center and/or the edge of the showerhead. A vacuum pump, e.g., a one or two stage mechanical dry pump and/or turbomolecular pump 398a, may be used to draw process gases out of the process chamber 391 and to maintain a pressure within the process chamber 391. A valve-controlled conduit may be used to fluidically connect the vacuum pump to the process chamber 391 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed. Volatile byproducts may be removed from the process chamber 391 through port 398b. The apparatus 390 also includes a system controller 399 to receive input and/or supply control signals. System controllers are described further below.

Figure 4:
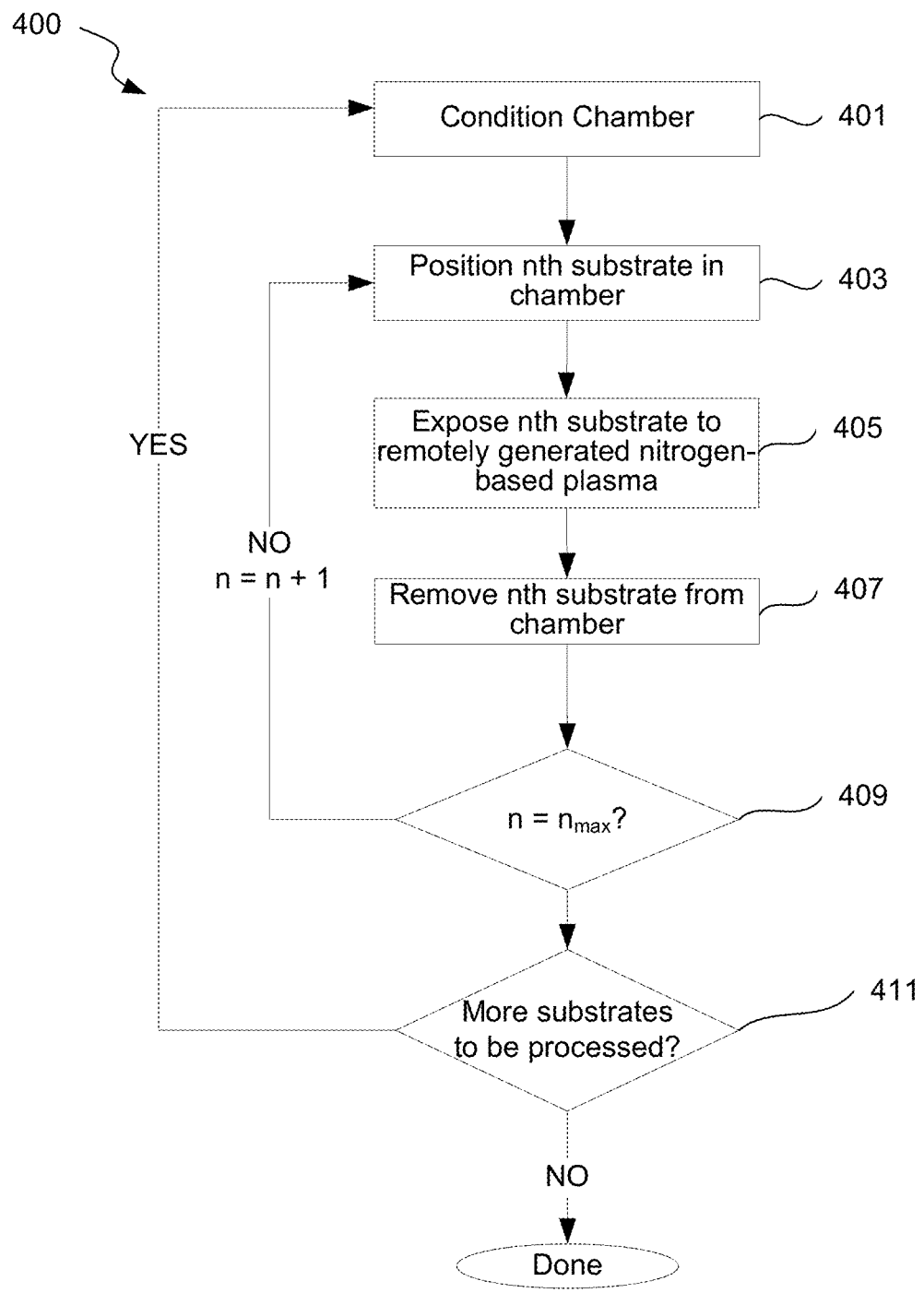
FIG. 4 is a flowchart showing an example of method of remote plasma processing in accordance with certain embodiments.

FIG. 4 illustrates a general process flowchart representing a method 400 of remote plasma processing in accordance with certain embodiments. First, a chamber is conditioned. Block 401. Methods of conditioning a chamber are described further below. Examples of chambers are described above with respect to FIGS. 2 and 3. In the example of FIG. 4, the chamber is free of a wafer or other substrate that is to be processed. A dummy substrate (also referred to as a test substrate) that is not to be otherwise processed may be positioned in the chamber in some embodiments. The term "fabrication substrate" is used herein to distinguish wafers and other substrates that are undergoing processes to be fabricated into devices (e.g., semiconductor logic and memory devices) from dummy or test substrates.

An $n^{th}$ substrate is then positioned in the chamber (block 403), with the first substrate after chamber conditioning being n=1. As described further below, chamber conditioning may be performed every $n_{max}$ substrates. The $n^{th}$ substrate is then exposed to a remotely generated nitrogen-based plasma. (Block 405). A nitrogen-based plasma is a plasma in which the primary chemically reactive species is nitrogen, typically in the form of nitrogen radicals. Other plasma species (e.g., inert gas species) may be present. In some implementations, other than nitrogen radicals, no non-inert components are present in the gas from which the plasma is generated except in trace amounts. In some embodiments, the nitrogen-based plasma is halogen-free. In many embodiments, a nitrogen-based plasma is formed from a $N_2$ gas, although other although other nitrogen gases such as forming gas, $NH_3$, or $N_2H_2$ may be used. The nth substrate is removed from the chamber. (Block 407). It should be noted that various other processing operations may be performed while the $n^{th}$ substrate is in the chamber in some embodiments. These include deposition of material or etching of deposited material on the substrate.

At a decision block 409, it is determined if $n=n_{max}$. If it does not, then the process returns to block 403, with positioning another substrate in the chamber. If $n=n_{max}$, at decision block 411, it is determined if more substrates are to be processed. If so, the process returns to block 401 for chamber conditioning. Otherwise the process is complete, with all substrates in the run processed.

Chamber conditioning involves exposing the chamber to a remotely-generated fluorine-containing plasma. A fluorine-containing gas such as nitrogen trifluoride ($NF_3$), fluorine ($F_2$), sulfur hexafluoride ($SF_6$), or carbon tetrafluoride ($CF_4$) may be provide to the remote plasma generator. Fluorine species, typically neutral species such as atomic fluorine, condition the chamber. In some embodiments, the plasma that conditions the chamber has no ionic species. Species generated from inert gases may be present.

Figure 5:
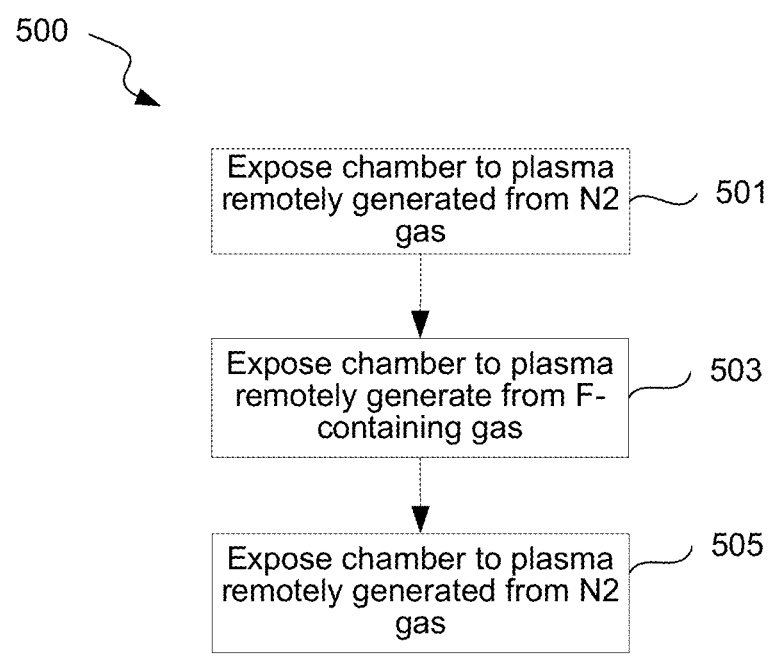
FIG. 5 is a flowchart showing an example of a method of chamber conditioning for a remote plasma processing chamber.

In some embodiments, the chamber conditioning process includes exposure to a remotely generated non-fluorine containing nitrogen plasma before and/or after the exposure to the fluorine-containing plasma. FIG. 5 is a flowchart showing an example of a method 500 of chamber conditioning for a remote plasma processing chamber that includes these operations. The chamber is exposed to a plasma remotely generated from $N_2$ gas. Block 501. While $N_2$ is provided as an example in FIG. 5, the same gas used for the remote nitrogen-based plasma processing of the substrate (e.g., block 405 in FIG. 4) is used in blocks 501 and 505 of FIG. 5. Accordingly, in other embodiments, the plasma in these blocks may be generated from other nitrogen-containing gases as described above. Next, the chamber is exposed to a plasma remotely generated from a F-containing gas. Block 503. The chamber is then exposed to a remotely generated $N_2$ plasma. Block 505. Typically, the duration of block 505 is shorter than that of block 501 or 503. The operations in method 500 are described further below with respect to FIGS. 6-8.

Figure 6:
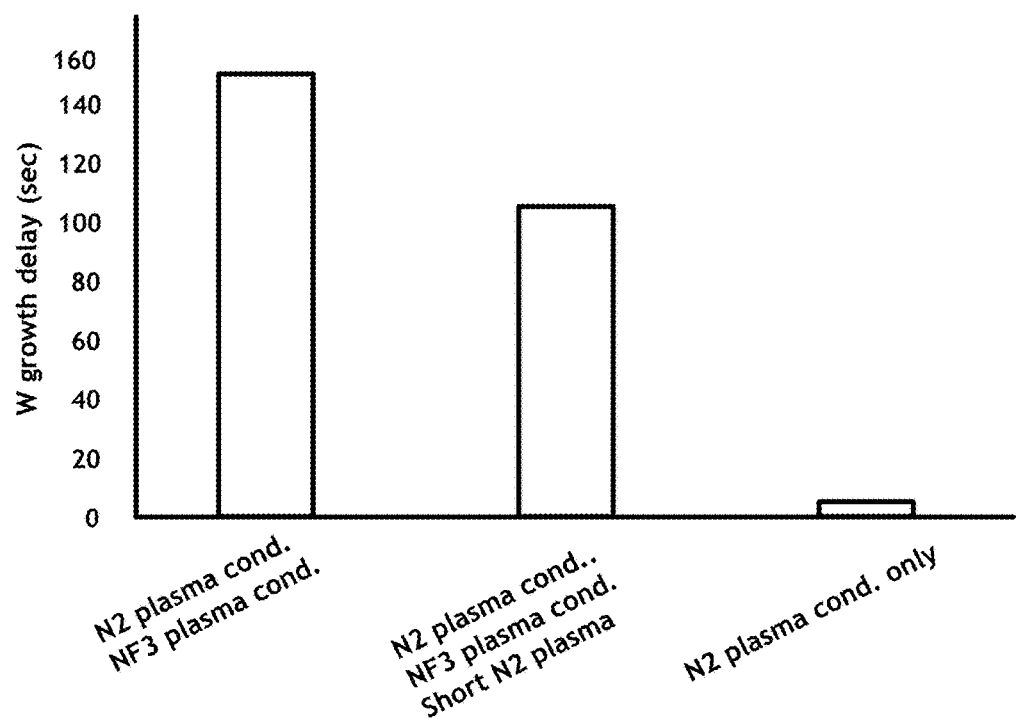
FIG. 6 is a chart that shows tungsten (W) growth delay on a substrate after various chamber conditioning processes.

As indicated above with respect to FIG. 1, in some embodiments, an $N_2$ plasma is used to inhibit tungsten or cobalt growth. FIG. 6 is a chart that shows tungsten (W) growth delay on a substrate after various chamber conditioning processes. A remote plasma processing chamber was conditioned with no substrate present, followed by substrate exposure to a $N_2$ remote plasma (i.e., a plasma remotely generated from $N_2$ gas) in the remote plasma processing chamber, followed by substrate exposure to a tungsten deposition chemistry such as $WF_6/H_2$. Tungsten growth delay, a metric of how effective the $N_2$ plasma treatment is, was measured.

Three chamber conditioning protocols were performed: (1) $N_2/NF_3$, (2) $N_2/NF_3/N_2$ (short), and (3) $N_2$ only. The $N_2$ only treatment results in a very low growth delay. In comparison the $NF_3$ treatments increase the growth delay significantly (from less than 10 s to over 100 s).

Without being bound by a particular theory, it is believed that the fluorine reacts with and forms a passivation layer on components in the chamber, such as aluminum fluoride ($AlF_3$). Without such a passivation layer, the nitrogen radicals ($N^*$) used in the nitrogen-based remote plasma processing may be lost to interactions with the showerhead, and in some cases, other components of the chamber. Returning to FIG. 6, a short $N_2$ plasma after the $NF_3$ reduces the $N_2$ plasma efficacy as measured by W growth delay. However, in some embodiments, a short $N_2$ plasma after the $NF_3$ may be useful to return the chamber to conditions like those experienced during the $N_2$ plasma processing. Wafer-to-wafer uniformity may be improved.

According to various embodiments, the chamber conditioning may passivate one or more of a showerhead, chamber walls, and other hardware components in the chamber. The surfaces of these components may contribute to a nitrogen radical loss rate that results both in wafer-to-wafer non-uniformity as well as within-wafer non-uniformity. The result is a more uniform and stable nitrogen radical flux in the subsequent nitrogen-based remotely generated plasma processing operations. Further, by controlling the loss rate of N radicals, the conditioning can be used alongside other result-effective variables (such as time, power and temperature) to control the total amount of inhibition on a substrate in nitrogen inhibition processes.

While the chamber conditioning described above uses a remote plasma, in some embodiments, the conditioning process may employ a non-plasma process prior to the nitrogen-based remote plasma processing operation. In some other embodiments, the conditioning process may employ a non-plasma process prior to the nitrogen-based remote plasma processing operation. For example, a fluorine-containing thermal deposition process may be used to deposit a passivation layer on chamber components prior to processing using nitrogen radicals. The passivation layer may be a fluorine-containing layer that limits N radical loss. In some embodiments, a wafer may be present in the chamber during a conditioning process if it does not affect the wafer or if the chamber conditioning process may be used to treat the wafer.

Figure 7:
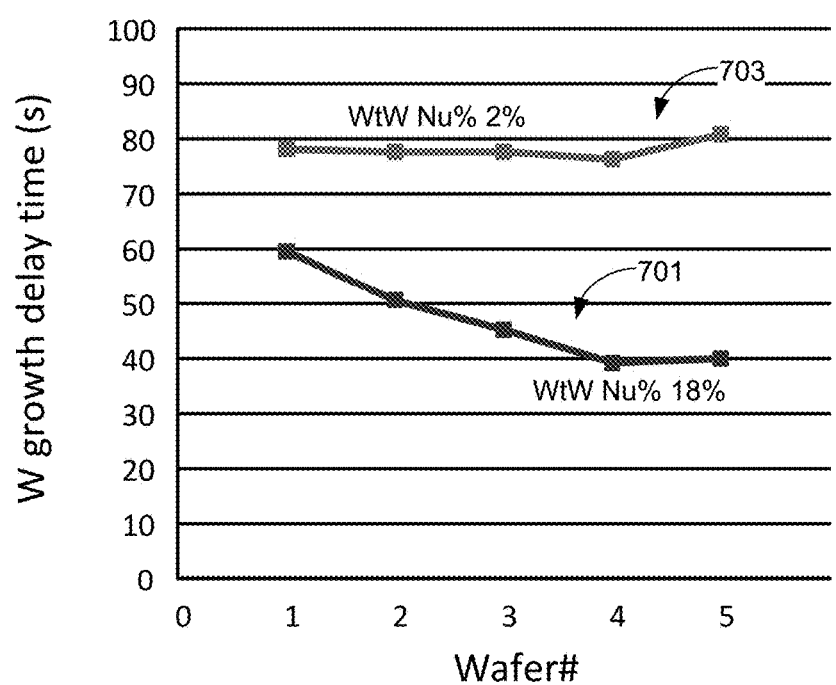
FIG. 7 is a plot illustrating wafer-to-wafer uniformity with and without a fluorine conditioning operation performed prior to a nitrogen-based processing.

The processes described herein provided improved wafer-to-wafer uniformity and improved within-wafer (center-to-edge) uniformity. FIG. 7 is a plot illustrating wafer-to-wafer uniformity with and without a fluorine conditioning operation performed prior to a nitrogen-based processing. Five wafers were processed (remotely generated $N_2$ plasma+ subsequent tungsten deposition) to generate each of curves 701 and 703. Curve 701 represents tungsten growth delay for five wafers processed without fluorine-containing ($NF_3$) conditioning. Curve 703 represents tungsten growth delay for five wafers processed after fluorine-containing ($NF_3$) conditioning. The wafer-to-wafer non-uniformity (WtW Nu %) is 18% for the wafers processed without $NF_3$ conditioning and only 2% for the wafers processed after $NF_3$ conditioning.

Figure 8:
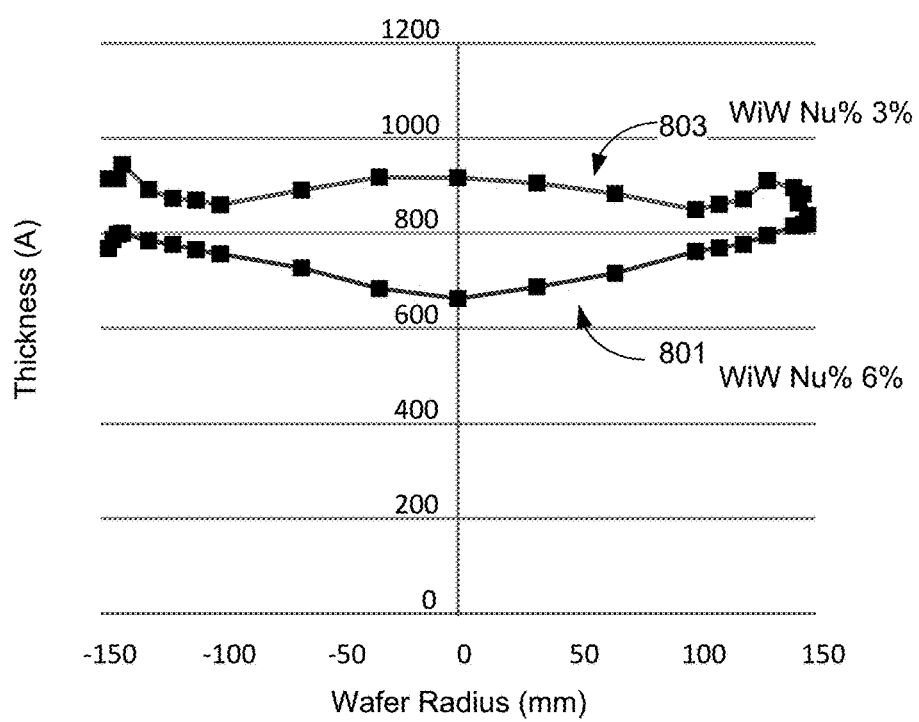
FIG. 8 is a plot illustrating within-wafer uniformity with and without a fluorine conditioning operation performed prior to a nitrogen-based processing.

FIG. 8 is a plot illustrating within-wafer uniformity with and without a fluorine conditioning operation performed prior to a nitrogen-based processing. Curve 801 represents tungsten thickness of a 300 mm wafer processed without fluorine-containing ($NF_3$) conditioning. Curve 803 represents tungsten thickness across a 300 mm wafer processed after fluorine-containing ($NF_3$) conditioning. The within wafer non-uniformity (WiW Nu %) is 6% for the wafer processed without $NF_3$ conditioning and only 3% for the wafer processed after $NF_3$ conditioning.

Figure 9:
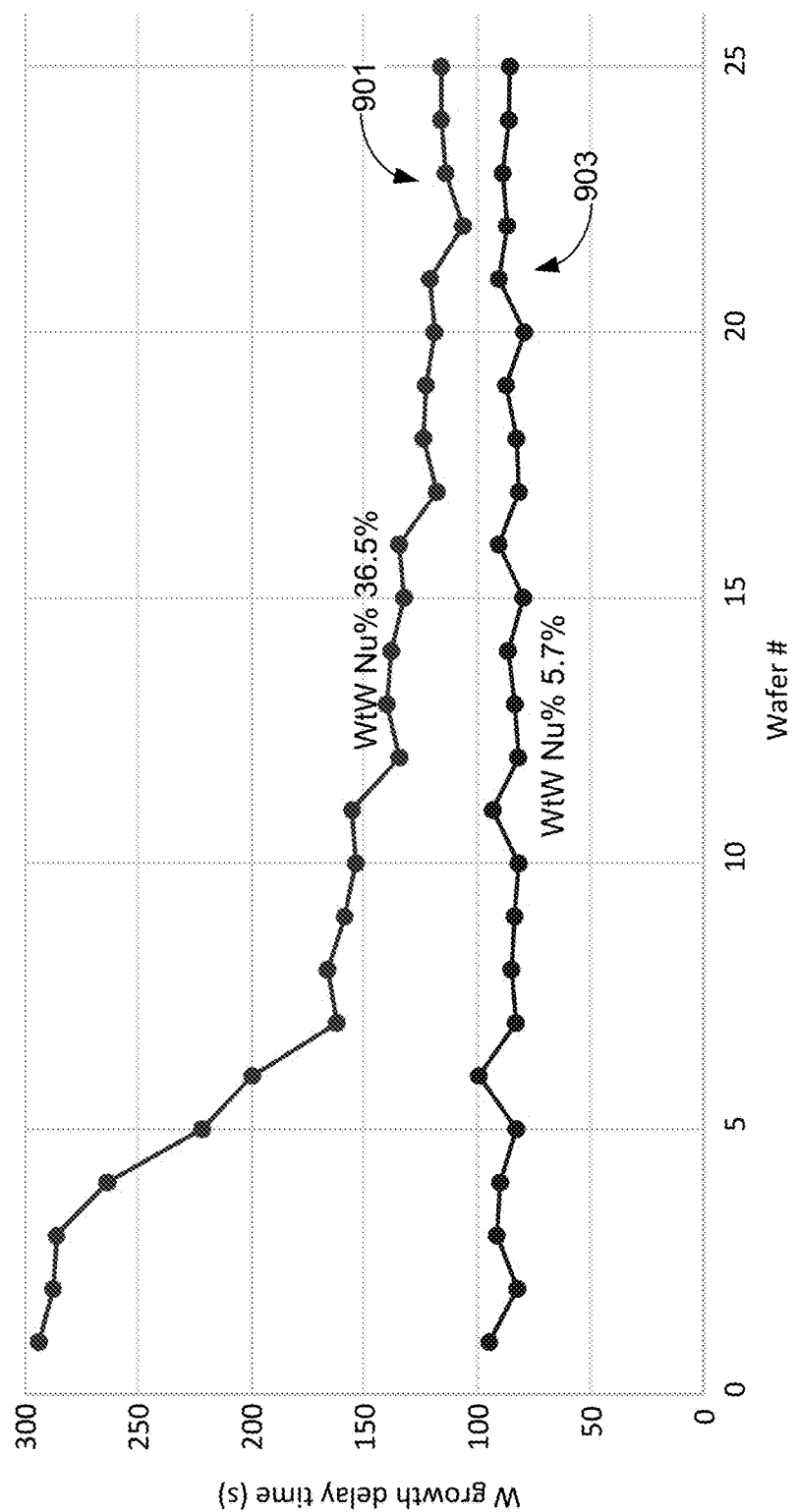
FIG. 9 is a plot illustrating wafer-to-wafer uniformity with and without a periodic fluorine conditioning operation performed prior to a nitrogen-based processing of multiple wafers.

Referring back to FIG. 4, a chamber can be conditioned once every $n_{max}$ wafers. An appropriate $n_{max}$ will depend on the chamber, particular conditioning process, particular treatment process, as well as on the tolerance for wafer-to-wafer and within-wafer non-uniformity. In some embodiments, a chamber may be conditioned after each wafer (such that $n_{max}$ is one). More typically, a chamber may be conditioned only once after remote plasma processing of multiple wafers, e.g., every 3, 4, 5, 7, 10, 15 wafers, etc. FIG. 9 is a plot illustrating wafer-to-wafer uniformity with and without a periodic fluorine conditioning operation performed prior to a nitrogen-based processing of multiple wafers. Twenty-five wafers were processed (remotely generated $N_2$ plasma+ subsequent tungsten deposition) to generate each of curves 901 and 903. Curve 901 represents tungsten growth delay for twenty-five wafers processed after a single fluorine-containing ($NF_3$) conditioning. Curve 903 represents tungsten growth delay for twenty-five wafers processed with fluorine-containing ($NF_3$) conditioning performed every five wafers. The wafer-to-wafer non-uniformity (WtW Nu %) is 36.5% for the wafers processed without periodic $NF_3$ conditioning and only 5.7% for the wafers processed with periodic $NF_3$ conditioning.

Curve 901 of FIG. 9 also provides evidence that, in some embodiments, it is useful to not end the conditioning process with a fluorine-containing remotely-generated plasma. This is because there is a steep fall-off in tungsten growth delay from wafer 1 to wafer 7, indicating that a certain amount of fluoride present on chamber components will consume N* radicals causing a drift in the process. By ending the chamber conditioning with a short $N_2$ plasma, this drift effect can be mitigated.

Figure 10:
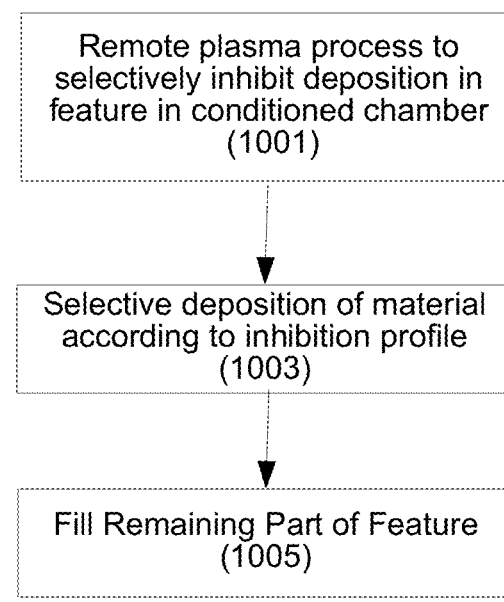
FIG. 10 is a flowchart showing an example of a method of filling a feature with material in accordance with certain embodiments.

Examples of chambers that may be conditioned according to the methods described herein are described above with respect to FIGS. 2 and 3. As described above with respect to FIG. 1, a remotely generated nitrogen-based plasma may be used to selectively inhibit growth of tungsten, cobalt, or other material in a feature. FIG. 10 is a flowchart showing an example of a method of filling a feature with material in accordance with certain embodiments. The methods described herein can be used to fill vertical features, such as in tungsten vias, and horizontal features, such as vertical NAND (VNAND) wordlines. The methods may be used for both conformal fill and bottom-up/inside-out fill. Examples of applications include logic and memory contact fill, DRAM buried wordline fill, vertically integrated memory gate and wordline fill, and 3-D integration using through-silicon vias.

First, a remote plasma process to selectively inhibit deposition in a feature is performed in a conditioned chamber. (Block 1001). Block 1001 is performed in a chamber conditioned with a fluoride-containing compound as described above. In some embodiments, chamber components include passivating fluorine-containing layers (e.g., $AlF_3$) on their surfaces. This operation creates an "inhibition profile" in the feature, with deposition preferentially inhibited at one or more locations of the feature with respect to one or more other locations.

Next, selective deposition of material according to the inhibition profile is performed. Block 1003. Block 1003 may involve one or more chemical vapor deposition (CVD) and/or atomic layer deposition (ALD) processes, including thermal, plasma-enhanced CVD and/or ALD processes. The deposition is selective in that the material preferentially grows on the lesser- and non-inhibited portions of the feature. In some embodiments, block 1003 involves selectively depositing material in a bottom or interior portion of the feature until a constriction is reached or passed. After selective deposition according to the inhibition profile is performed, the method can continue at block 1005 with filling the rest of the feature. In some embodiments, block 1005 may involve continuing a CVD deposition process started at block 1003. Such a CVD process may result in deposition on the inhibited portions of the feature, with nucleation occurring more slowly than on the non-inhibited portions of the feature. In some embodiments, block 1005 may involve deposition of a nucleation layer over at least the inhibited portions of the feature.

For tungsten deposition, a tungsten precursor and a reducing agent may be employed. Examples of precursors include tungsten hexafluoride ($WF_6$), tungsten hexachloride ($WCl_6$), tungsten pentachloride ($WCl_5$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen can be used as the reducing agent in the deposition, other reducing agents including silane may be used in addition or instead of hydrogen. In another embodiment, tungsten hexacarbonyl ($W(CO)_6$) may be used with or without a reducing agent. In a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using CVD are described in U.S. patent application Ser. Nos. 12/202, 126, 12/755,248 and 12/755,259, which are incorporated by reference herein in their entireties for the purposes of describing tungsten deposition processes. According to various embodiments, the methods described herein are not limited to a particular method of filling a feature but may include any appropriate deposition technique. In certain embodiments, the nucleation layer is deposited using a PNL technique. In a PNL technique, pulses of a reducing agent, optional purge gases, and tungsten-containing precursor can be sequentially injected into and purged from the reaction chamber. The process is repeated in a cyclical fashion until the desired thickness is achieved. PNL broadly embodies any cyclical process of sequentially adding reactants for reaction on a semiconductor substrate, including ALD techniques. PNL techniques for depositing tungsten nucleation layers are described in U.S. Pat. Nos. 6,635,965; 7,589,017; 7,141,494; 7,772,114; 8,058,170; and 8,623,733 and in US Patent Publication No. 20100267230, which are incorporated by reference herein in their entireties for the purposes of describing tungsten deposition processes In some embodiments, block 1005 involves repeating blocks 1001 and 1003 one or more times. Further, in some embodiments, block 1005 may involve a non-conformal etch as described in U.S. Patent Publication No. 20130302980, which is incorporated by reference herein in its entirety for the purposes of describing non-conformal etching in fill processes.

Precursors that may be used in cobalt deposition are described in U.S. Pat. No. 9,349,637 which is incorporated by reference herein in its entirety for the purposes of describing cobalt feature fill.

CVD and ALD deposition of other materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as Tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel (CpAllylNi) and $MeCp_2Ni$. Examples of co-reactants can include $N_2$, $NH_3$, $N_2H_4$, $N_2H_6$, $SiH_4$, $Si_3H_6$, $B_2H_6$, $H_2$, and $AlCl_3$.

Returning to FIG. 10, according to various embodiments, deposition in block 1003 may take place in the same or different chamber as the remote plasma processing of block 1001. In the latter case, the wafer or other substrate is transferred to another chamber prior to block 1003. Further, in some embodiments, blocks 1001 and 1003 may be performed in the same station or different stations of a multi-station chamber.

Figure 11A:
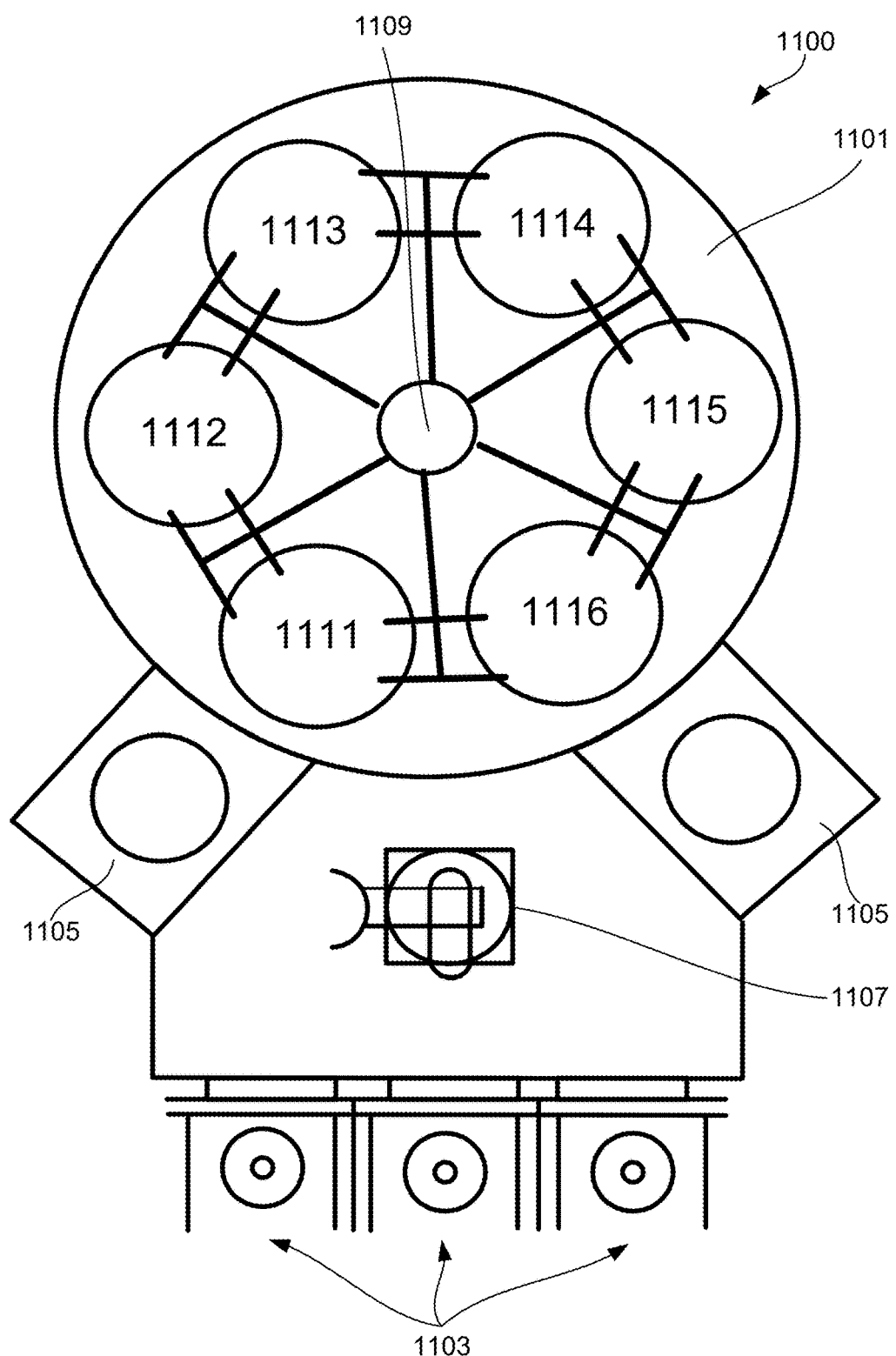
FIG. 11A shows a schematic example of a multi-station apparatus.

FIG. 11A shows an example of a multi-station apparatus 1100. The apparatus 1100 includes a process chamber 1101 and one or more cassettes 1103 (e.g., Front Opening Unified Ports) for holding substrates to be processed and substrates that have completed processing. The chamber 1101 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 11A illustrates the process chamber 1101 having six stations, labeled 1111 through 1116. All stations in the multi-station apparatus 1100 with a single process chamber 1103 are exposed to the same pressure environment. However, each station may have a designated reactant distribution system and local plasma and heating conditions achieved by a dedicated plasma generator and pedestal, such as the ones illustrated in FIGS. 2 and 3.

A substrate to be processed is loaded from one of the cassettes 1103 through a load-lock 1105 into the station 1111. An external robot 1107 may be used to transfer the substrate from the cassette 1103 and into the load-lock 1105. In the depicted embodiment, there are two separate load locks 1105. These are typically equipped with substrate transferring devices to move substrates from the load-lock 1105 (once the pressure is equilibrated to a level corresponding to the internal environment of the process chamber 1103) into the station 1111 and from the station 1116 back into the load-lock 1105 for removal from the processing chamber 1103. An internal robot 1109 is used to transfer substrates among the processing stations 1111-1116 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIGS. 2 and 3. For example, a station 1111 may receive a substrate from a load-lock and be used to pre-heat the substrate before being further processed. Other stations may be used for filling high aspect ratio features including remote plasma treatment, deposition, or selective removal operations.

After the substrate is heated or otherwise processed at the station 1111, the substrate is moved successively to the processing stations 1112, 1113, 1114, 1115, and 1116, which may or may not be arranged sequentially. The multi-station apparatus 1100 is configured such that all stations are exposed to the same pressure environment. In so doing, the substrates are transferred from the station 1111 to other stations in the chamber 1101 without a need for transfer ports, such as load-locks.

An internal robot 1109 is used to transfer substrates between stations 1111-1116. In the example of FIG. 11, the robot 1109 includes a fin with at least one arm for each processing station (shown extending between stations). Any suitable transfer mechanism may be used.

In certain embodiments, one or more stations may be used to fill features with tungsten-containing materials. For example, station 1112 may be used for an initial deposition operation, station 1113 may be used for a selective inhibition operation, and station 1114 for a selective deposition operation. In the embodiments where a deposition-removal cycle is used, station 1114 may be used for another deposition operation and station 1115 may be used for selective removal operation. Station 516 may be used for the final filling operation. It should be understood that any configurations of station designations to specific processes (e.g., heating, inhibiting, depositing, and removal) may be used.

Figure 11B:
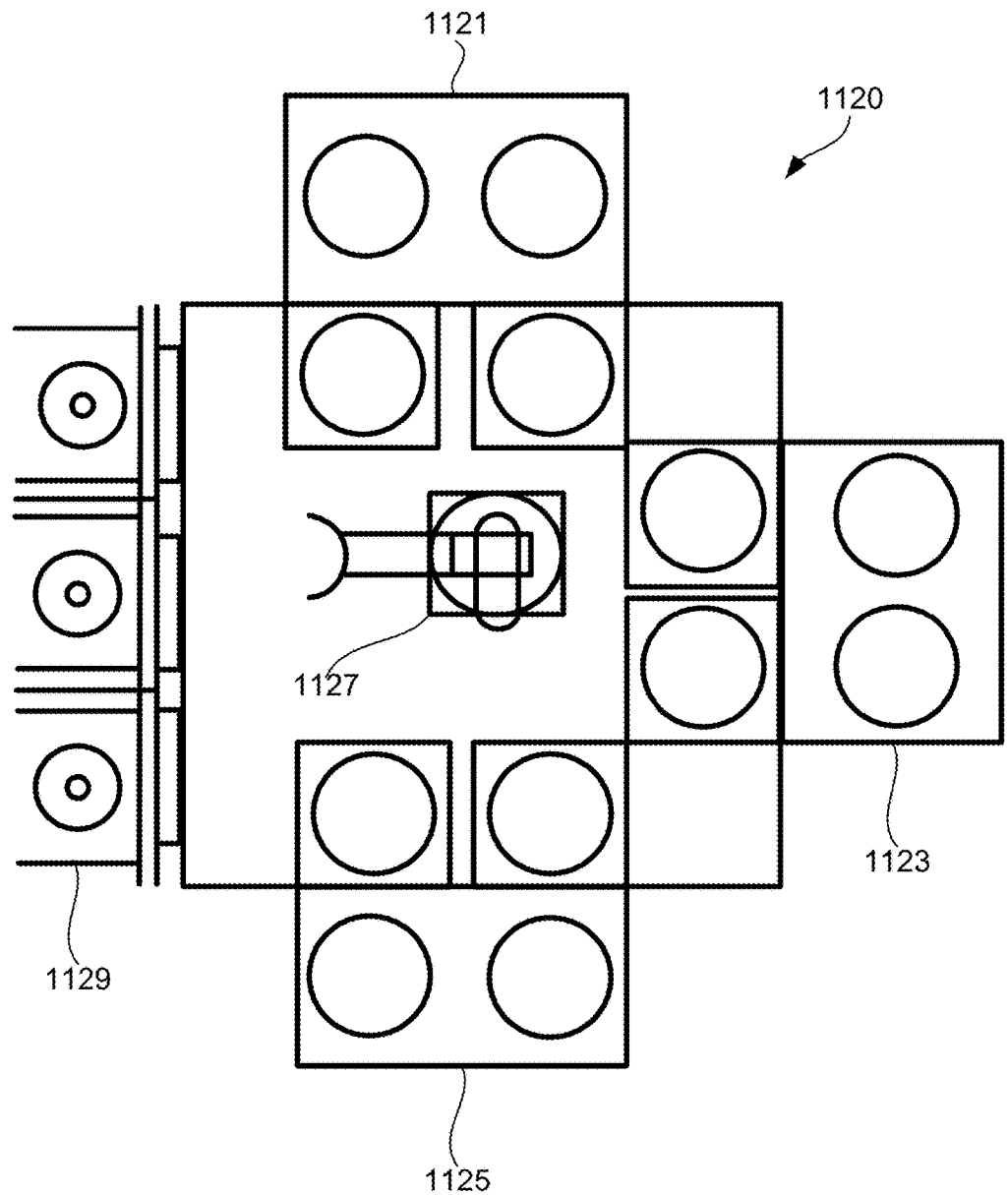
FIG. 11B shows a schematic example of a multi-chamber apparatus.

FIG. 11B is a schematic illustration of a multi-chamber apparatus 1120 that may be used in accordance with certain embodiments. As shown, the apparatus 1120 has three separate chambers 1121, 1123, and 1125. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 1121-1125 has its own pressure environment, which is not shared between chambers. Each chamber may have one or more corresponding transfer ports (e.g., load-locks). The apparatus may also have a shared substrate handling robot 1127 for transferring substrates between the transfer ports one or more cassettes 1129.

As noted above, separate chambers may be used for remote plasma processing and depositing tungsten containing materials and/or selective removal of these deposited materials in later operations. Separating operations into different chambers can help to substantially improve processing speeds by maintaining the same environmental conditions in each chamber. In other words, a chamber does not need to change its environment from conditions used for remote plasma processing to conditions used for deposition or selective removal and back, which may involve different reactants, different temperatures, pressures, and other process parameters. In certain embodiments, it is faster to transfer partially manufactured semiconductor substrates between two or more different chambers than changing environmental conditions of these chambers.

Returning to FIG. 2, in certain embodiments, a system controller 222 is employed to control process parameters. Likewise in FIG. 3, a system controller 399 may be used to control process parameters.

In some embodiments, a system controller (e.g., system controller 222 or system controller 399, which may include one or more physical or logical controllers) controls some or all of the operations of a process chamber. The system controller may include one or more memory devices and one or more processors. In some embodiments, the apparatus (e.g., apparatus 200 or apparatus 390) includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the system controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the disclosed embodiments. Accordingly, the present embodiments are to be considered as illustrative and not restrictive, and the disclosed embodiments are not to be limited to the details given herein.

What is claimed is:

1. A method comprising:
performing a conditioning process on a remote plasma processing chamber, the conditioning process comprising:
introducing a fluorine-containing gas to a plasma generator to generate a fluorine-containing conditioning plasma;
inletting the fluorine-containing conditioning plasma to the remote plasma processing chamber, wherein the remote plasma processing chamber includes a substrate support and a showerhead and the showerhead is disposed between the substrate support and the plasma generator and wherein, during the conditioning process, no fabrication substrate is present in the remote plasma processing chamber, wherein the conditioning process further comprises introducing a nitrogen-containing compound to the plasma generator to generate a fluorine-free nitrogen-based conditioning plasma and inletting the fluorine-free nitrogen-based conditioning plasma to the remote plasma processing chamber;
after performing the conditioning process, introducing a fabrication substrate to the remote plasma processing chamber; and
exposing the fabrication substrate to a remotely generated nitrogen-based plasma.

2. The method of claim 1, wherein the fabrication substrate comprises one or more features to be filled.

3. The method of claim 1, wherein the remotely generated nitrogen-based plasma is generated from $N_2$ gas.

4. The method of claim 1, further comprising sequentially introducing one or more additional fabrication substrates to the remote plasma processing chamber and exposing each to a remotely generated nitrogen-based plasma.

5. The method of claim 4, wherein at least three fabrication substrates are introduced to the remote plasma processing chamber prior to performing another conditioning process.

6. The method of claim 1, wherein the remotely generated nitrogen-based plasma selectively inhibits nucleation near a feature opening with respect to the interior of the feature.

7. The method of claim 6, further comprising selectively depositing tungsten or cobalt in the feature in the interior of the feature with respect to near the feature opening.

8. The method of claim 1, wherein the conditioning process comprises forming a fluorine-containing layer on one or more chamber components.

9. The method of claim 1, wherein the conditioning process comprises forming an aluminum fluoride layer on one or more chamber components.

10. A method comprising:
performing multiple conditioning and processing cycles to sequentially process a plurality of substrates in a remote plasma processing chamber, wherein each cycle comprises:
a) performing a conditioning process comprising:
introducing a fluorine-containing gas to a plasma generator to generate a fluorine-containing conditioning plasma,
inletting the fluorine-containing conditioning plasma to the remote plasma processing chamber, and
inletting a fluorine-free nitrogen-based conditioning plasma to the remote plasma processing chamber, wherein the remote plasma processing chamber includes a substrate support and a showerhead and the showerhead is disposed between the substrate support and the plasma generator and wherein, during the conditioning process, no fabrication substrate is present in the remote plasma processing chamber;
b) after the conditioning process and prior to repeating the conditioning process, performing a plurality of nitrogen plasma exposure processes each of which comprises:
i) introducing a fabrication substrate to the remote plasma processing chamber;
ii) exposing the fabrication substrate to a remotely generated nitrogen-based plasma; and
iii) removing the fabrication substrate form the remote plasma processing chamber.

11. The method of claim 10, wherein the fabrication substrate comprises one or more features to be filled.

12. The method of claim 10, wherein the remotely generated nitrogen-based plasma is generated from $N_2$ gas.

13. The method of claim 10, wherein the remotely generated nitrogen-based plasma is generated from a nitrogen-containing compound and the conditioning process further comprises introducing the nitrogen-containing compound to the plasma generator to generate a fluorine-free nitrogen-based conditioning plasma, and inletting the fluorine-free nitrogen-based conditioning plasma to the remote plasma processing chamber.

14. A method comprising:
    conditioning a remote plasma processing chamber, the conditioning comprising:
        inletting a fluorine-containing conditioning plasma to the remote plasma processing chamber; and
        inletting a first fluorine-free nitrogen-based conditioning plasma to the remote plasma processing chamber,
    wherein the remote plasma processing chamber includes a substrate support and a showerhead and the showerhead is disposed between the substrate support and a plasma generator and wherein, during the conditioning, no fabrication substrate is present in the remote plasma processing chamber.

15. The method of claim 14, further comprising:
    after conditioning the remote plasma processing chamber, introducing a substrate having one or more features to the remote plasma processing chamber, each feature comprising a feature opening;
    exposing the substrate to nitrogen radicals;
    selectively inhibiting nucleation on surfaces of the one or more features that are at or near the feature openings such that a differential inhibition profile in each feature is formed; and
    depositing material in the feature in accordance with the differential inhibition profile.

16. The method of claim 15, wherein the material is tungsten or cobalt.

17. The method of claim 15, wherein the material is deposited in the remote plasma processing chamber.

18. The method of claim 15, wherein the material is deposited in a chamber separate from the remote plasma processing chamber.

19. The method of claim 14, wherein the conditioning further comprises, after inletting the fluorine-containing conditioning plasma, inletting a second fluorine-free nitrogen-based conditioning plasma to the remote plasma processing chamber.

20. The method of claim 19, wherein the duration of the second fluorine-free nitrogen-based conditioning plasma is longer than the first fluorine-free nitrogen-based conditioning plasma.

21. The method of claim 14, wherein the conditioning further comprises, prior to inletting the fluorine-containing conditioning plasma, inletting a second fluorine-free nitrogen-based conditioning plasma to the remote plasma processing chamber.

* * * * *